United States Patent
Choi et al.

(10) Patent No.: US 7,306,987 B2
(45) Date of Patent: Dec. 11, 2007

(54) CAPACITOR AND METHOD FOR FABRICATING THE SAME

(75) Inventors: Chee Hong Choi, Seoul (KR); Dong Yeal Keum, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 106 days.

(21) Appl. No.: 11/319,482

(22) Filed: Dec. 29, 2005

(65) Prior Publication Data

US 2006/0145234 A1 Jul. 6, 2006

(30) Foreign Application Priority Data

Dec. 30, 2004 (KR) .................... 10-2004-0117006

(51) Int. Cl.
*H01L 21/8242* (2006.01)

(52) U.S. Cl. .................. 438/250; 438/253; 438/393; 257/E27.048

(58) Field of Classification Search ........ 438/238–241, 438/250–256, 393–399, 381; 257/E27.048
See application file for complete search history.

(56) References Cited

U.S. PATENT DOCUMENTS 5,744,387 A * 4/1998 Tseng .................... 438/253

* cited by examiner

*Primary Examiner*—H. Jey Tsai
(74) *Attorney, Agent, or Firm*—McKenna Long & Aldridge LLP

(57) ABSTRACT

A capacitor structure and a method of fabricating the capacitor structure wherein. The lower electrode and the upper electrode are constructed to be separated from each other by a predetermined interval and to be engaged with each other using a series of alternating ridges so that an effective surface area can increase within a limited area.

7 Claims, 7 Drawing Sheets

N+  N+, P+  P+

CAPACITOR AND METHOD FOR FABRICATING THE SAME

CROSS REFERENCE TO RELATED APPLICATIONS

This application claims the benefit of Korean Patent Application No. 10-2004-0117006, filed on Dec. 30, 2004, which is hereby incorporated by reference as if fully set forth herein.

BACKGROUND OF THE INVENTION

1. Field of the Invention

The present invention relates to capacitors, and more particularly, to a capacitor and a method for fabricating the same, which increases an effective surface area through a simplified process.

2. Discussion of the Related Art

A unit cell of a semiconductor device is generally constructed with one transistor and one capacitor for storing an electrical charge as a unit of memory. As device integration increases, the area of the unit cell decreases. However, while the capacitor's layout area should be minimized, a sufficient capacitance must be maintained. These goals may be achieved by, for example, using a thinner dielectric or higher-k dielectrics. However, a dielectric layer of an ultra thin film tends to deteriorate reliability while higher-k materials usually require special processing. Therefore, a preferred approach is to increase the capacitor's effective surface area, i.e. the total area of opposing lower and upper electrodes abutting an insulating layer.

A typical capacitor uses a polysilicon-insulator-polysilicon structure, and a method of reaching such a structure is illustrated in FIG. 1.

Referring to FIG. 1, a lower polysilicon 11, a dielectric layer 12, and an upper polysilicon 13 are sequentially deposited on a semiconductor substrate 10 where various devices, interconnection lines, and a planarization layer may be formed. The lower polysilicon layer 11 serves as the lower electrode of a capacitor, and the upper electrode may be formed by patterning an upper polysilicon 13 by a typical photolithography process.

After the upper polysilicon 13 is patterned to form the upper electrode of the capacitor on the substrate 10, the dielectric layer 12 and the lower polysilicon 11 are patterned to form the dielectric member and the lower electrode of the capacitor. Similar to the patterning of the upper polysilicon 13, the patterning of the dielectric layer 12 and the lower polysilicon 11 are performed by using a typical photolithography process, i.e. a process that involves forming a photosensitive film on the substrate 10 where the upper polysilicon 13 is patterned, exposing and developing using a mask to form a pattern of the photosensitive film, etching the dielectric layer 12 and the lower polysilicon 11 exposed by the pattern of the photosensitive film, and removing a remaining pattern of the photosensitive film.

The insulating layer 14 and the planarization layer 15 are formed on the substrate 10 where the capacitor constructed with the lower electrode, the dielectric member, and the upper electrode is formed. After that, the planarization layer 15 and the insulating layer 14 are etched to form contact holes for exposing the upper polysilicon 13 and the lower polysilicon 11. Similar to the patterning of the upper polysilicon 13, the etching of the insulating layer 14 and the planarization layer 15 is performed by using a typical photolithography process, i.e. by forming a photosensitive film, exposing and developing using a mask to form a pattern of the photosensitive film, etching the planarization layer 15 and the underlying insulating layer 14 exposed by the pattern of the photosensitive film, and removing a remaining pattern of the photosensitive film.

A conductive material filling the contact hole is then formed and patterned on the substrate 10 where the contact hole is formed. Next, a ground node 16 electrically connected to the lower polysilicon 11 and a power supply node 17 electrically connected to the upper polysilicon 13 are formed. The patterning of the conductive material may likewise be performed by using a typical photolithography process.

The method for fabricating a capacitor as described above, requires at least four photolithography steps and seven deposition steps which unduly complicate the process and increase production costs. In addition, the lower electrode and the upper electrode are stacked in a planar structure, making for a large layout of the unit cell.

SUMMARY OF THE INVENTION

Accordingly, the present invention is directed to a capacitor and a method of fabricating the same that substantially obviates one or more problems due to limitations and disadvantages of the related art.

One advantage of the present invention is that it can provide a capacitor and a method of fabricating the same capable of forming a capacitor by using a minimized number of processes.

Another advantage of the present invention is that it can provide a capacitor and a method of fabricating the same capable of increasing an effective surface area of a capacitor.

Another advantage of the present invention is that it can provide a capacitor and a method of fabricating the same capable of implementing a capacitor having a high capacitance in a limited area of a unit cell.

Additional advantages and features of the invention will be set forth in part in the description which follows, and in part will become apparent from the description or by practice of the invention.

To achieve these and other advantages in accordance with an embodiment of the present invention, as embodied and broadly described herein, a capacitor structure comprises a lower electrode, constructed of a first polysilicon layer patterned in a series of ridges by implanting first conductivity type impurity ions and forming a first silicide layer stacked on an upper portion of the first polysilicon layer, an upper electrode, constructed of a second polysilicon layer patterned in a series of ridges by implanting second conductivity type impurity ions and a second silicide layer stacked on an upper portion of the second polysilicon layer, the upper electrode being separated from the lower electrode by a predetermined interval and being engaged with the lower electrode, and a dielectric layer separating the lower and upper electrodes.

According to another aspect of the present invention, a method of fabricating a capacitor structure, comprises patterning polysilicon on a substrate, performing an ion implantation process in which ions are implanted in the patterned polysilicon, the implanted ions including first conductivity type impurity ions and second conductivity type impurity ions forming a first region in which the first conductivity type impurity ions are implanted, a second region in which the second conductivity type impurity ions are implanted, and a third region in which the first conductivity type impurity ions and the second conductivity type impurity ions are simultaneously implanted wherein the third region is a boundary region between the first region and the second region, forming a silicide layer on the first region and the second region, etching the third region to expose the substrate, and forming a dielectric layer in the etched third region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention.

In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
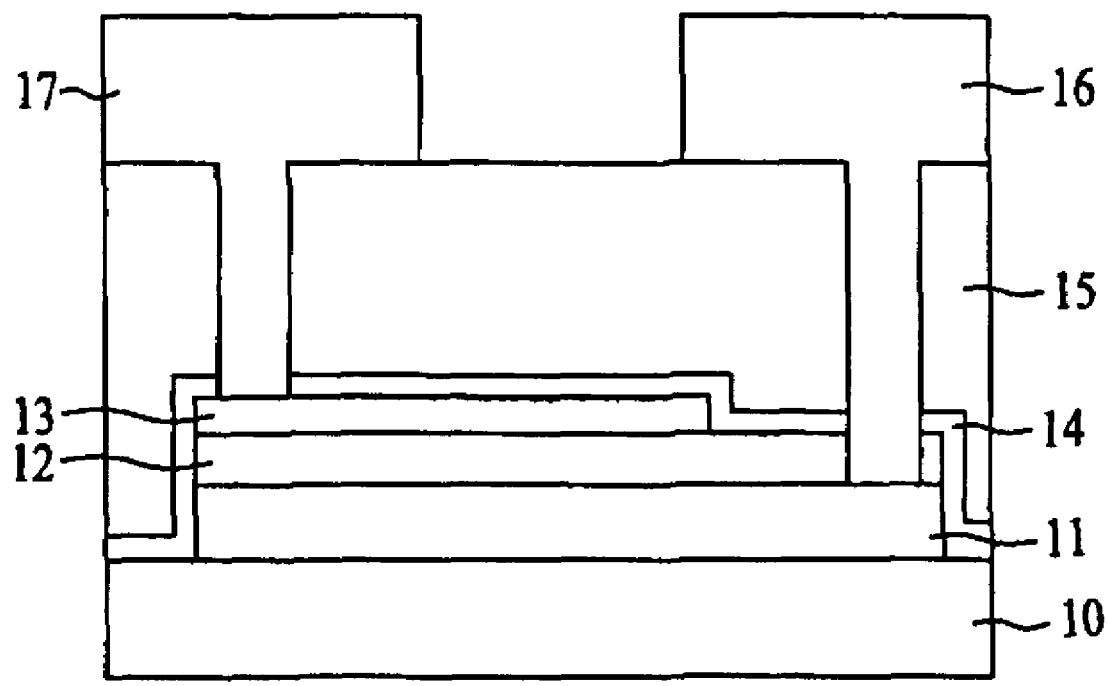
FIG. 1 is a schematic cross-sectional view of a typical polysilicon-insulator-polysilicon capacitor.
Figure 2A:
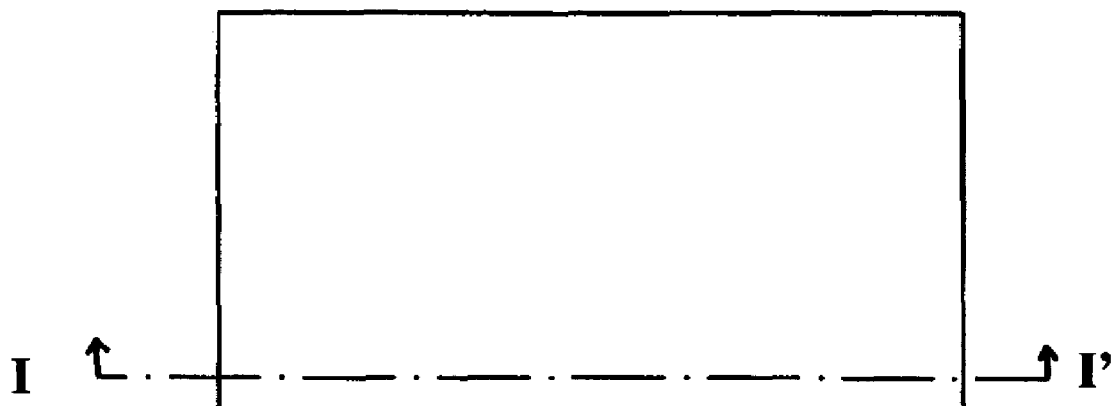
FIGS. 2A-2F are views of a polysilicon-insulator-polysilicon capacitor, respectively illustrating sequential steps of a method for fabricating a capacitor according to exemplary embodiments of the present invention, in which each drawing includes a planar view and a cross-sectional view along line I-I' or line II-II' of the planar view.
Figure 2A:
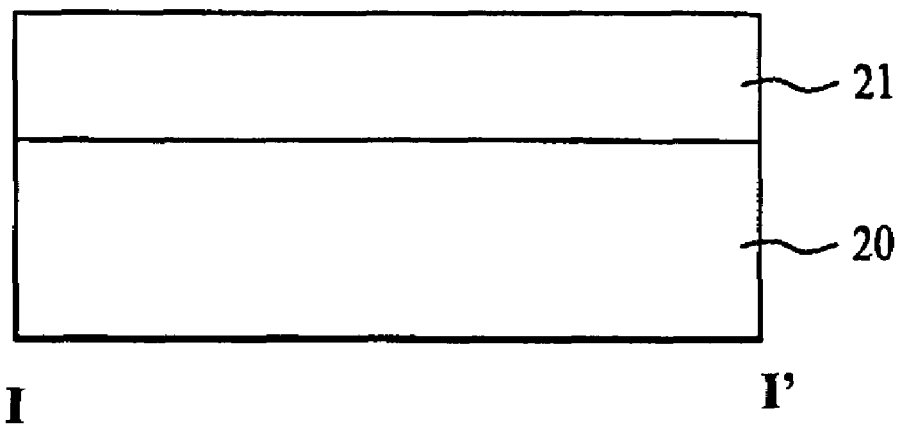

As shown in FIG. 2A, a polysilicon 21 is deposited on a substrate 20 and then patterned. The process for depositing and patterning the polysilicon 21 is simultaneously performed with a depositing and patterning process for forming a gate electrode of a semiconductor device, i.e. a metal-oxide-silicon (MOS) transistor, formed on the substrate 20.

Figure 2B:
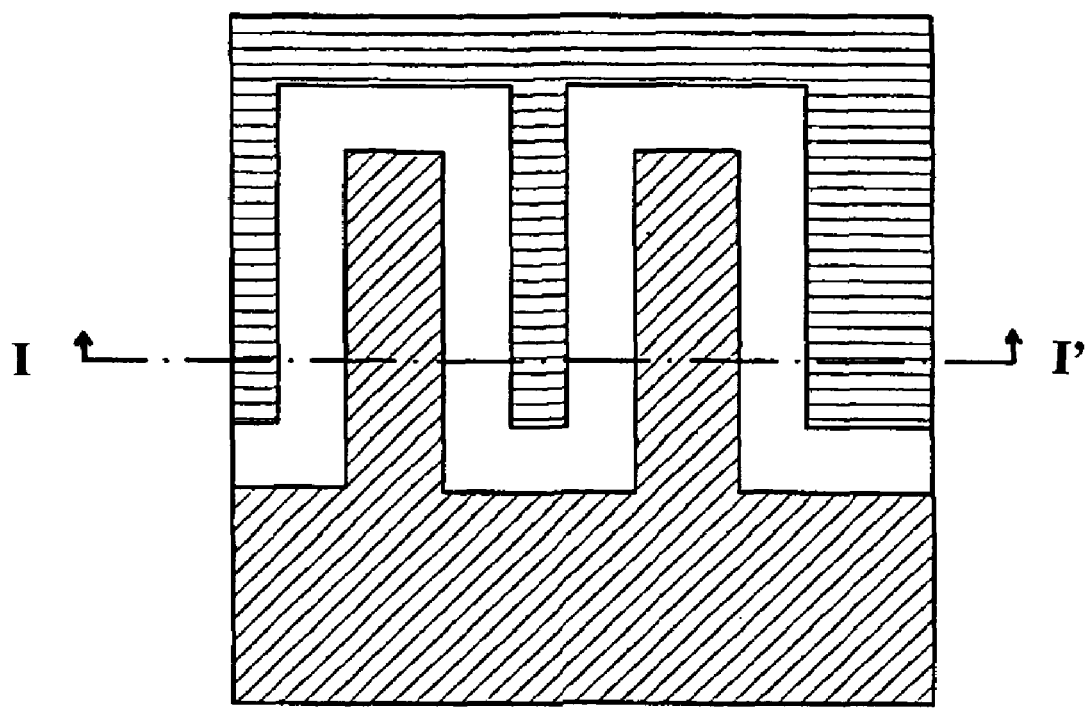
Figure 2B:
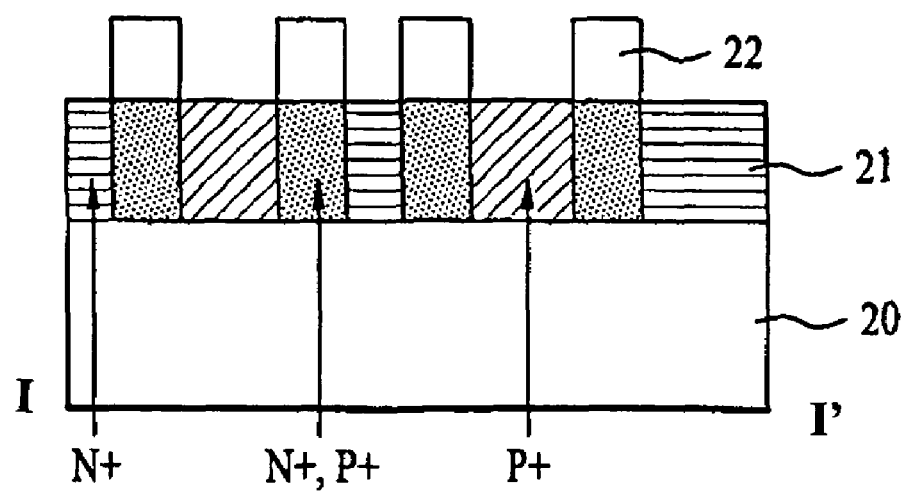

As shown in FIG. 2B, N-type impurity ions and P-type impurity ions are implanted into the polysilicon 21 to form a first region N+ in which the N-type impurity ions are implanted and a second region P+ in which the P-type impurity ions are implanted, and at the same time, to form a third region (N+, P+) in which the N-type impurity ions and the P-type impurity ions are simultaneously implanted in a boundary region between the first region N+ and the second region P+. The process for implanting the N-type impurity ions and the P-type impurity ions are performed simultaneously with an ion implantation process for forming the source/drain of the MOS transistor.

The first region N+ and the second region P+ form a series of alternating ridges that are to be engaged with each other and are separated by a predetermined interval according to the third region (N+, P+). A native oxide film 22 is formed in the third region (N+, P+) in which the N-type impurity ions and the P-type impurity ions are simultaneously implanted to the polysilicon 21 by a phenomena called "butting."

Figure 2C:
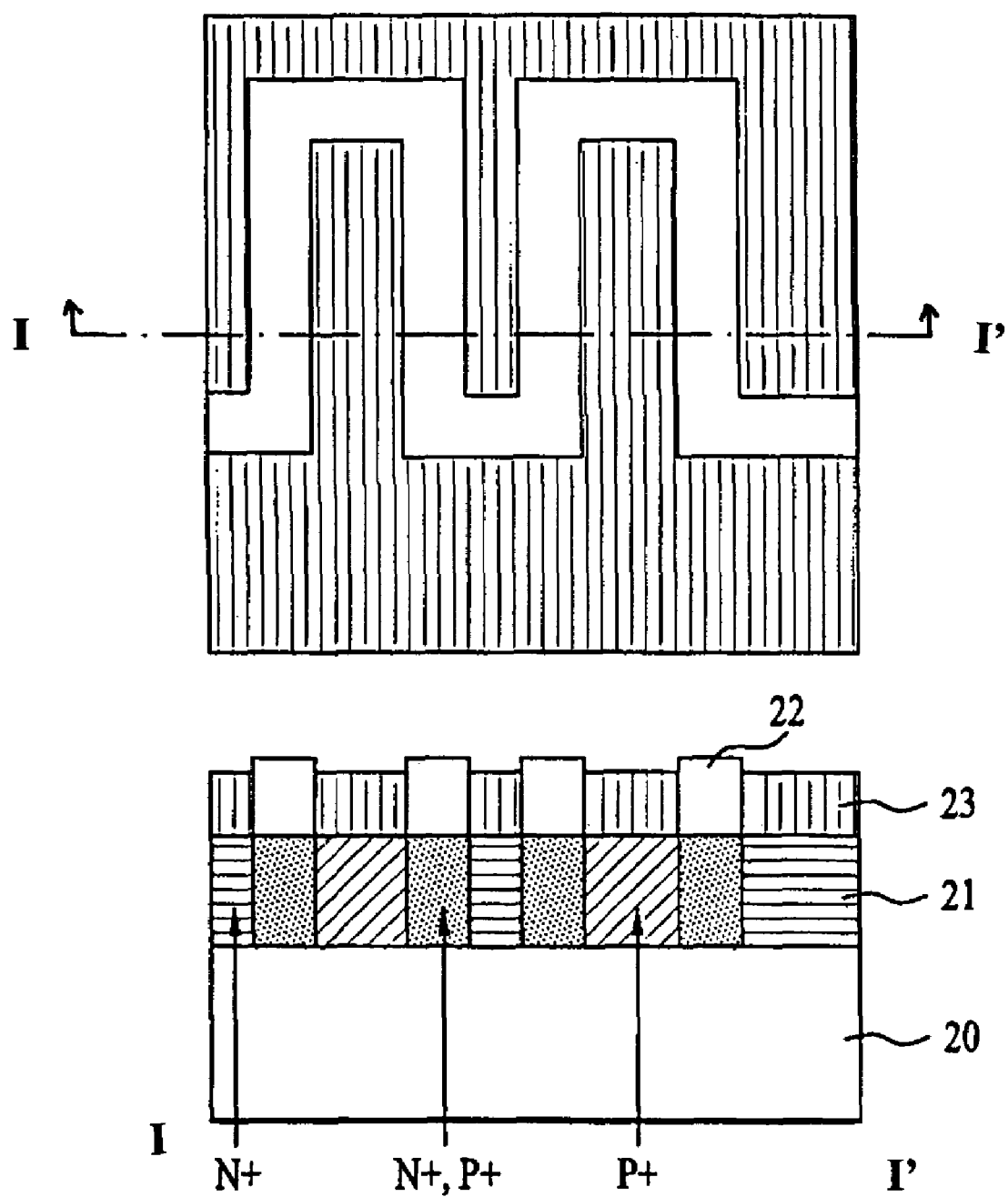

As shown in FIG. 2C, a silicide layer 23 is selectively formed on upper surfaces of the first region N+ and the second region P+. Here, the process for forming the silicide layer 23 is simultaneously performed with a process for forming silicide self-aligned to surfaces of the data electrode and the source/drain in order to reduce resistance values of the gate electrode and the source/drain of the aforementioned MOS transistor on the substrate 20.

The process for forming the self-aligned silicide in based on the principle that, when a refractory metal is deposited and subjected to a thermal treatment process, a silicide reaction is induced on the surfaces of the first region N+ and the second region P+ to form the silicide layer 23, but the silicide reaction is not induced on the surface of the third region (N+, P+) due to the presence of the native oxide film 22. Therefore, refractory metal on the third region remains unreacted. By selectively removing the unreacted refractory metal on the surface of the native oxide film 22, the silicide layer 23 can be selectively formed on the surfaces of the first region N+ and the second region P+. The first region N+ and the silicide layer 23 serve as one electrode (for example, an upper electrode) of the capacitor, and the second region P+ and the silicide layer 23 serve as the other electrode (for example, a lower electrode) of the capacitor.

Figure 2D:
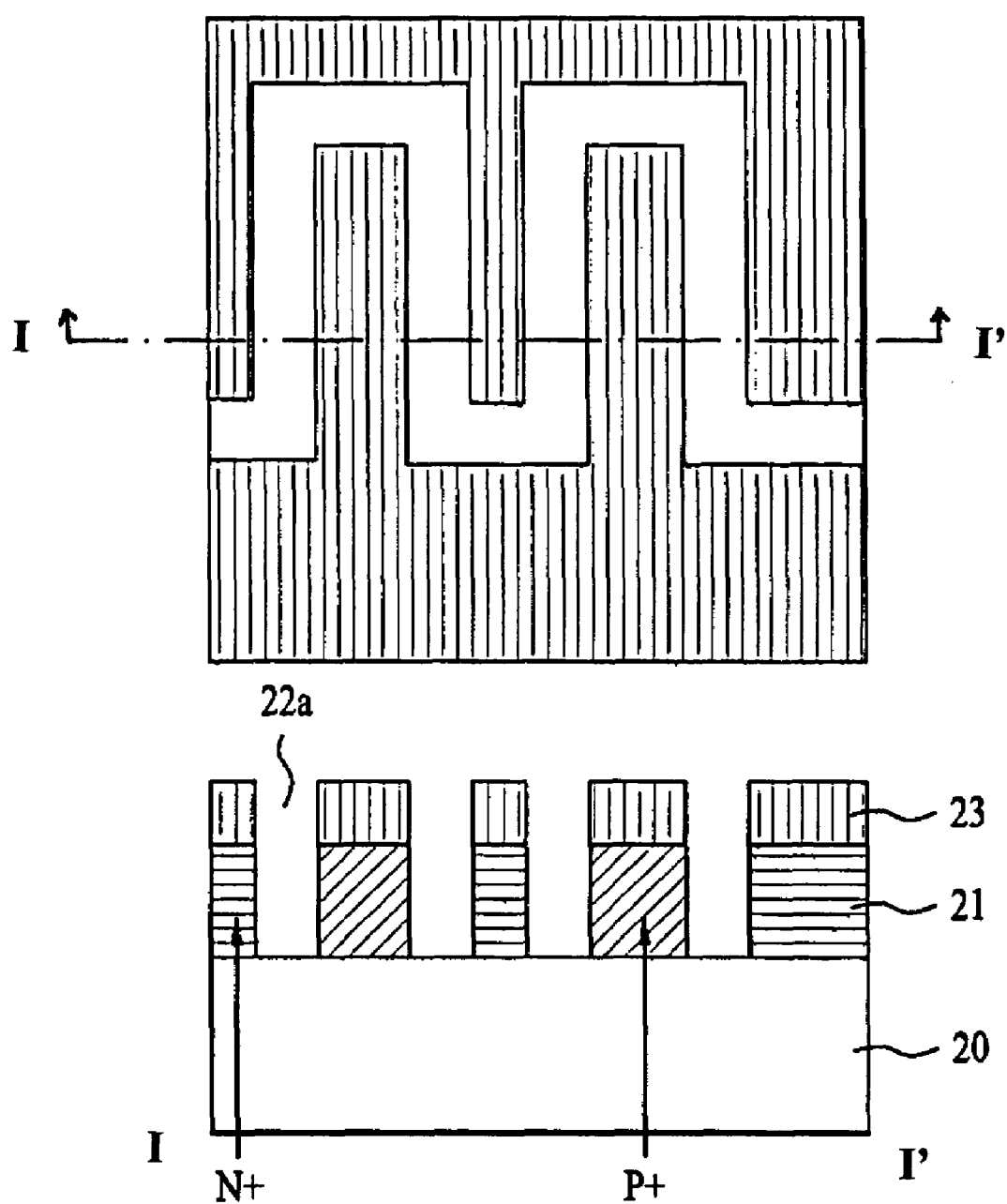

As shown in FIG. 2D, the native oxide film 22 is selectively etched, and the third region (N+, P+) of the polysilicon 21 is also etched, so that a contact hole 22a for exposing the substrate 20 is formed. The process for etching the native oxide film 22 and the third region (N+, P+) of the polysilicon 21 is performed by a typical photolithography process, in which a photosensitive film is formed on the native oxide film 22 and the silicide layer 23 and exposing and developing steps using a mask form a pattern of the photosensitive film, so that the native oxide film 22 exposed by the pattern of the photosensitive film and the third region (N+, P+) of the polysilicon 21 may be etched. After the photolithography process, the remaining pattern of the photosensitive film is stripped away. The process for etching the native oxide film 22 and the third region (N+, P+) of the polysilicon 21 may also be performed by a blanket etching process using high selection ratios between the silicide layer 23 and the native oxide film 22 and between the silicide layer 23 and the polysilicon 21.

Figure 2E:
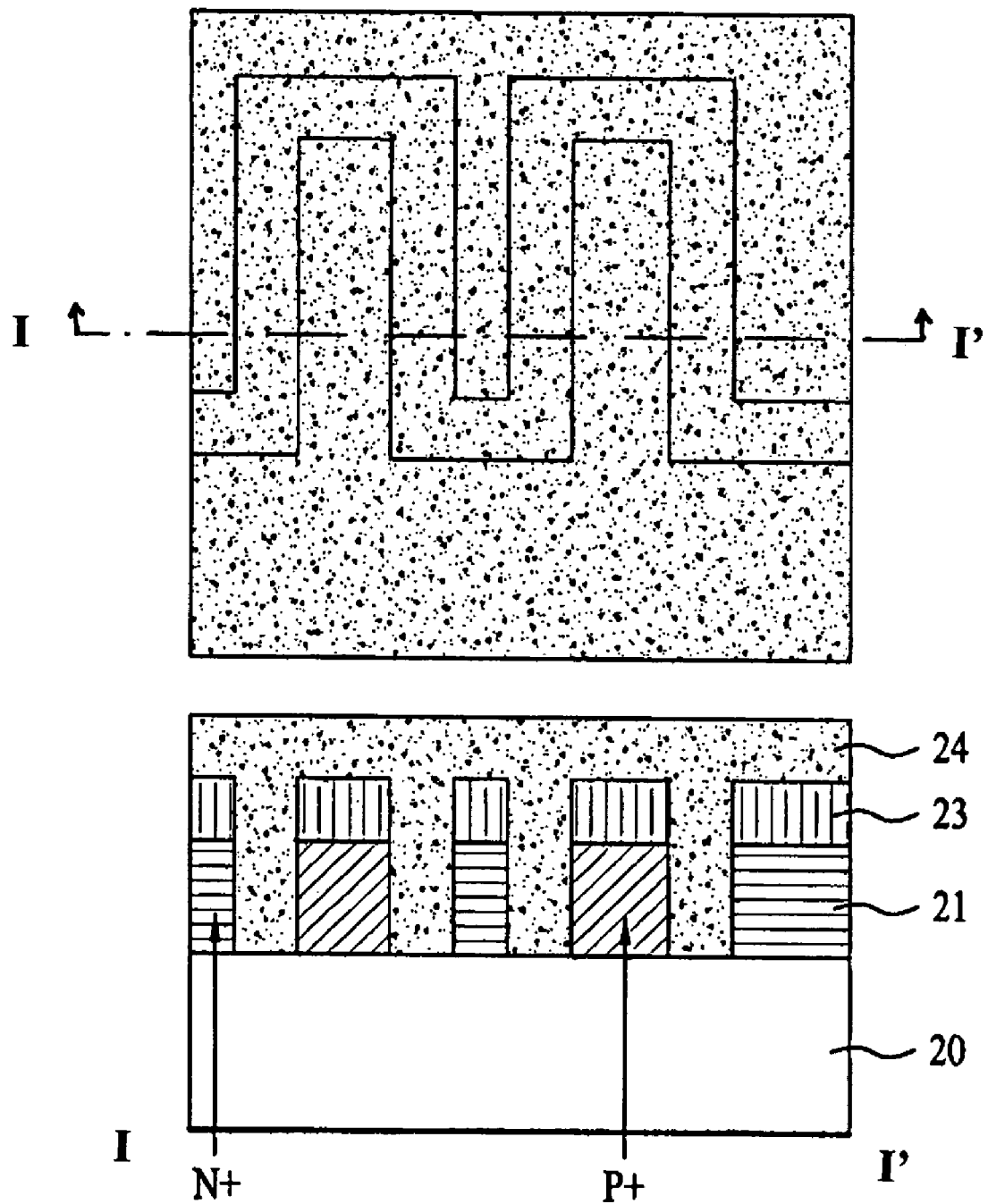

As shown in FIG. 2E, an insulating layer, for example, a silicon nitride layer 24, is deposited on an upper front surface of the substrate 20 where the contact hole is formed. The process for depositing the silicon nitride layer 24 is simultaneously performed with a process for depositing a silicon nitride layer used as an etch stop layer when forming a contact to the aforementioned semiconductor device on the substrate 20. The insulating layer, i.e. the silicon nitride layer 24 filling the contact hole, servers as a dielectric member of the capacitor. Since the capacitance of the capacitor varies depending on a width of the silicon nitride layer 24, a desired capacitance of the capacitor can be obtained by using a simple method of suitably defining the width of the third region (N+, P+) in which the N-type impurity ions and the P-type impurity ions are simultaneously implanted to the polysilicon 21.

Figure 2F:
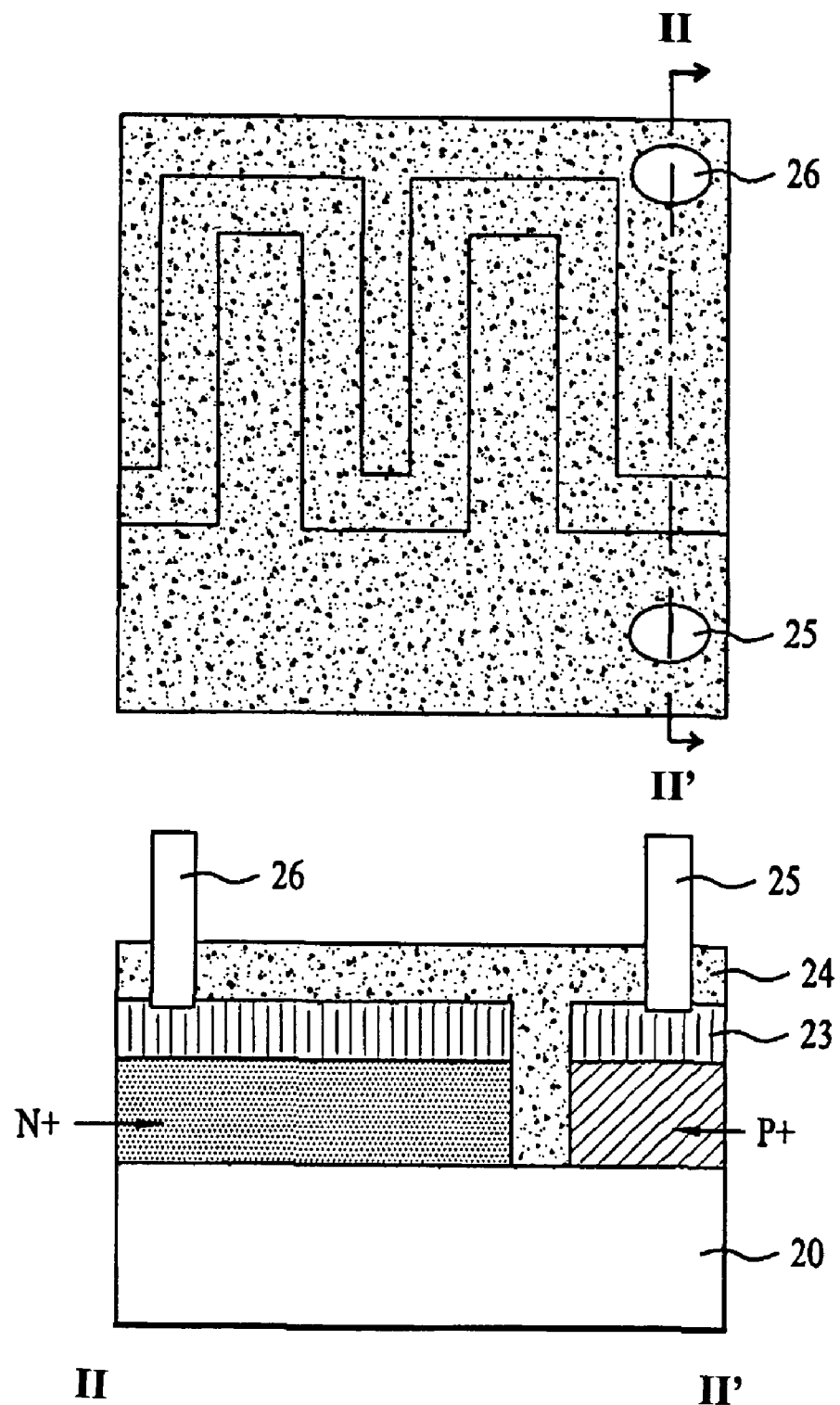

As shown in FIG. 2F, the silicon nitride layer 24 is etched to expose the silicide layer 23 formed on the first region N+ of the polysilicon 21 and the silicide layer 23 formed on the second region P+, and then, a conductive material is formed on the upper front surface thereof and patterned to form a ground node 25 electrically connected to the silicide layer 23 formed on the second region P+ of the polysilicon 21 and a power supply node 26 electrically connected to the first region N+ of the polysilicon 21. The etching of the silicon nitride layer 24 and the patterning of the conductive material is performed by using a typical photolithography process, i.e. by forming a photosensitive film, exposing and developing using a mask to form a pattern of the photosensitive film, etching the conductive material exposed by the pattern of the photosensitive film, and using the silicon nitride as etch stop layer and removing the remaining pattern of the photosensitive film.

According to an exemplary embodiment of the present invention, since the lower electrode, the dielectric member, and the upper electrode of the capacitor are formed during the process for forming the semiconductor devices on the substrate, the method for fabricating the capacitor can be simplified by reducing the number of separate processes to two or fewer photolithography processes and four or fewer deposition processes, thereby increasing yield and reducing costs. In addition, since the lower electrode and the upper electrode are constructed to be separated by a predetermined interval from each other and engaged with each other in a series of alternating ridges, the effective surface area and, in turn, capacitance, can be maximized by increasing the number of ridges of the lower electrode and the upper electrode, thereby enabling increased device integration. Moreover, by using a simple method of adjusting a width of the dielectric member between the lower electrode and the upper electrode, a desired capacitance can be accurately implemented.

It will be apparent to those skilled in the art that various modifications can be made in the present invention without departing from the spirit or scope of the invention. Thus, it is intended that the present invention cover such modifications provided they come within the scope of the appended claims and their equivalents.

What is claimed is:

1. A method of fabricating a capacitor, comprising:
patterning polysilicon on a substrate;
performing an ion implantation process in which ions are implanted in the patterned polysilicon, the implanted ions including first conductivity type impurity ions and second conductivity type impurity ions forming a first region in which the first conductivity type impurity ions are implanted, a second region in which the second conductivity type impurity ions are implanted, and a third region in which the first conductivity type impurity ions and the second conductivity type impurity ions are simultaneously implanted wherein the third region is a boundary region between the first region and the second region;
forming a silicide layer on the first region and the second region;
etching the third region to expose the substrate; and
forming a dielectric layer in the etched third region.

2. The method according to claim 1, wherein the dielectric layer is a silicon nitride layer.

3. The method according to claim 1, wherein the first region and the second regions of the polysilicon are separated by a predetermined interval and are engaged with each other in a series of alternating ridges.

4. The method according to claim 1, further comprising:
depositing and patterning to form a gate electrode of a MOS transistor on the substrate,
wherein the polysilicon patterning is performed simultaneously with the depositing and patterning to forming the gate electrode.

5. The method according to claim 1, further comprising:
forming, by ion implantation, a source/drain of a MOS transistor on the substrate,
wherein the first region is formed simultaneously with the ion implantation of the source/drain.

6. The method according to claim 1, further comprising:
forming a silicide self-aligned to surfaces of a gate electrode and source/drain of a MOS transistor on the substrate,
wherein the silicide layer is formed simultaneously with the self-aligned silicide.

7. The method according to claim 1, further comprising:
depositing an etch stop layer for forming a contact of a MOS transistor on the substrate,
wherein the dielectric layer is formed simultaneously with the etch stop layer.

* * * * *